United States Patent
Liu

(10) Patent No.: US 8,007,143 B2
(45) Date of Patent: Aug. 30, 2011

(54) LED ILLUMINATING DEVICE AND LIGHT ENGINE THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 321 days.

(21) Appl. No.: 12/477,901

(22) Filed: Jun. 3, 2009

(65) Prior Publication Data

US 2010/0225217 A1 Sep. 9, 2010

(30) Foreign Application Priority Data

Mar. 5, 2009 (CN) .......................... 200910300707.3

(51) Int. Cl.
*F21V 29/00* (2006.01)
(52) U.S. Cl. .................. 362/373; 362/249.02; 362/294; 362/218; 362/267
(58) Field of Classification Search .................. 362/218, 362/249.02, 294, 267, 373
See application file for complete search history.

(56) References Cited

U.S. PATENT DOCUMENTS

| | | | |
|---|---|---|---|
| 6,517,221 B1 * | 2/2003 | Xie | 362/373 |
| 6,550,530 B1 * | 4/2003 | Bilski | 165/104.26 |
| 7,674,012 B1 * | 3/2010 | Lin et al. | 362/249.02 |
| 7,922,365 B2 * | 4/2011 | Liu | 362/373 |
| 7,946,737 B2 * | 5/2011 | Liu | 362/373 |
| 2009/0268468 A1 * | 10/2009 | Liu | 362/294 |
| 2010/0141108 A1 * | 6/2010 | Liu et al. | 313/12 |
| 2011/0026251 A1 * | 2/2011 | Liu et al. | 362/249.02 |

* cited by examiner

*Primary Examiner* — Stephen F Husar
*Assistant Examiner* — James Cranson, Jr.
(74) *Attorney, Agent, or Firm* — Altis Law Group, Inc.

(57) ABSTRACT

An LED illuminating device includes an optical section, an electrical section, and a heat dissipation section. The heat dissipation section is provided with a loop heat exchange device. The loop heat exchange device includes a hollow metal base and a plurality of metal fins extending outwardly from the metal base. A hermetical chamber is defined in the metal base. The chamber is cylindrical and has a U-shaped cross section along an axial direction of the metal base. A wick structure is attached to an inner surface of the chamber. A working fluid is saturated in the wick structure. A light source is thermally attached to the metal base.

20 Claims, 6 Drawing Sheets

LED ILLUMINATING DEVICE AND LIGHT ENGINE THEREOF

BACKGROUND

1. Technical Field

Embodiments of the present invention generally relates to light emitting diode (LED) illuminating devices, and particularly to an LED illuminating device with a high heat dissipating efficiency and a light engine of the LED illuminating device.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

Therefore, it is desirable to provide an LED illuminating device with a high heat dissipating efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
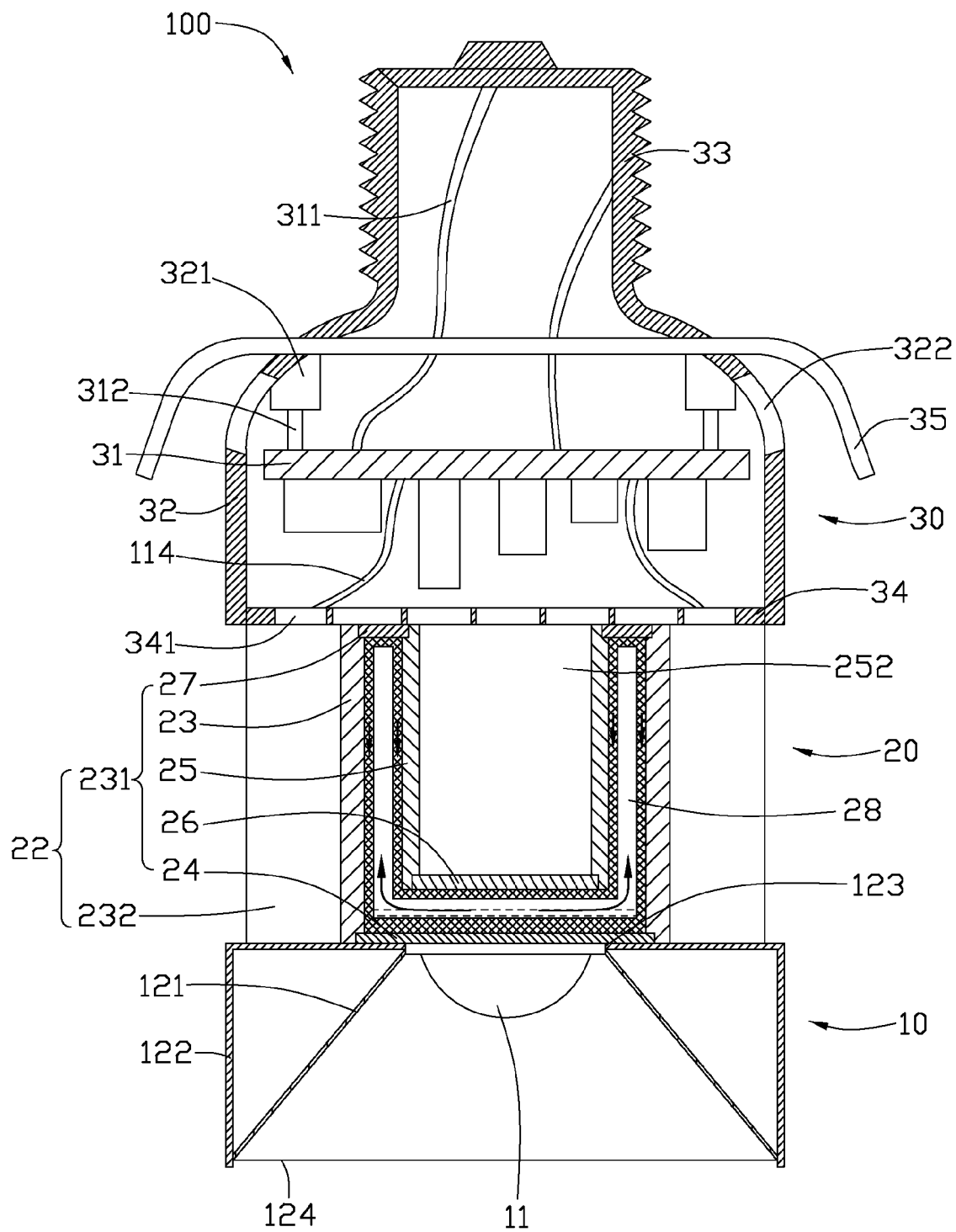
FIG. 1 is a cross-sectional view of an LED illuminating device in accordance with an exemplary embodiment.

Reference will now be made to the drawing figures to describe the various embodiments in detail.

FIG. 1 is a cross-sectional view of an LED illuminating device 100 in accordance with an embodiment of the present invention. The LED illuminating device 100 includes an optical section 10, an electrical section 30, and a heat dissipation section 20 arranged between the optical section 10 and the electrical section 30. The LED illuminating device 100 is substantially cylindrical. The optical section 10 is located at a front end of the LED illuminating device 100, while the electrical section 30 is located at a rear end of the LED illuminating device 100.

The optical section 10 includes a housing 122, a light reflector 121, a light source 11, and an optical lens 124. A rear end of the housing 122 is coupled to the heat dissipation section 20, and a front end of the housing 122 is provided with the optical lens 124. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end located adjacent to the heat dissipation section 20, and a front end mounted to the front end of the housing 122. The light reflector 121 and the optical lens 124 provide luminescence characteristics for the light source 11. An opening 123 is defined at the rear end of the light reflector 121 and the light source 11 is mounted at the opening 123. Light emitted by the light source 11 is reflected and guided by the light reflector 121 to an outside of the optical section 10 through the optical lens 124.

The electrical section 30 provides drive power, control circuit and power management for the light source 11. The electrical section 30 includes a casing 32 having a front end connected with the heat dissipation section 20, a lamp head 33 connected with a rear end of the casing 32, a partition plate 34 mounted at the front end of the casing 32, and a circuit board 31 received in the casing 32. A plurality of air passage holes 322 are radially defined through the casing 32 at a position adjacent to the lamp head 33. A dustproof cover 35 is provided over the air passage holes 322 for preventing dust from entering into an interior of the electrical section 30. The air passage holes 322 communicate the interior of the electrical section 30 with an outside environment and are utilized for dissipating heat of the circuit board 31. The partition plate 34 partitions the heat dissipation section 20 from the electrical section 30. The partition plate 34 is defined with a plurality of air passage openings 341 which communicate the heat dissipation section 20 with the electrical section 30. The circuit board 31 is mounted in the casing 32 of the electrical section 30 through a plurality of mounting seats 321 and a plurality of mounting poles 312. The mounting seats 321 are attached to an inner surface of the casing 32. The mounting poles 312 connect the circuit board 31 with the mounting seats 321.

The electrical section 30 is further provided with a plurality of electrical wires 114, 311 connected with the circuit board 31. The electrical wires 114 extend through the partition plate 34 and electrically connect with the light source 11. The electrical wires 311 electrically connect with the lamp head 33, whereby the LED illuminating device 100 can get power from an external power source via the lamp head 33.

Figure 2:
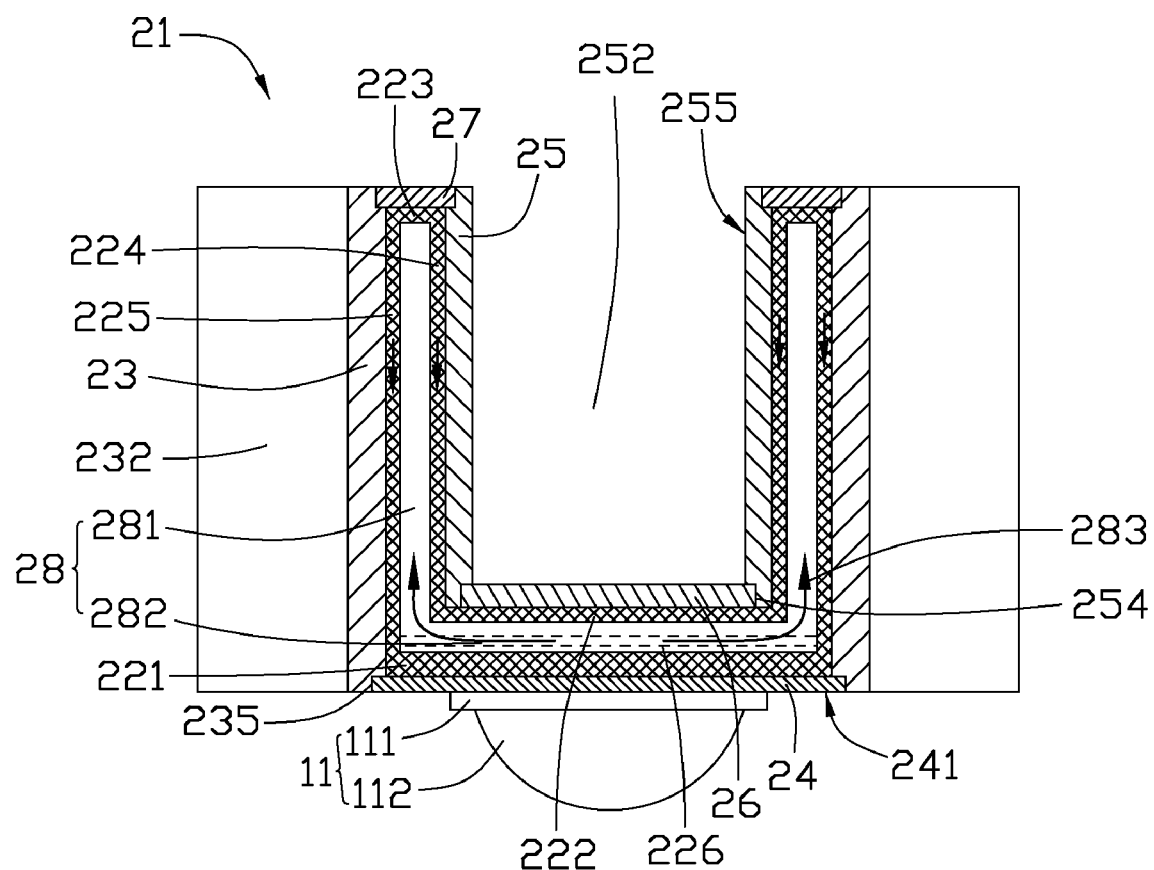
FIG. 2 shows a light engine of the LED illuminating device of FIG. 1.
Figure 3:
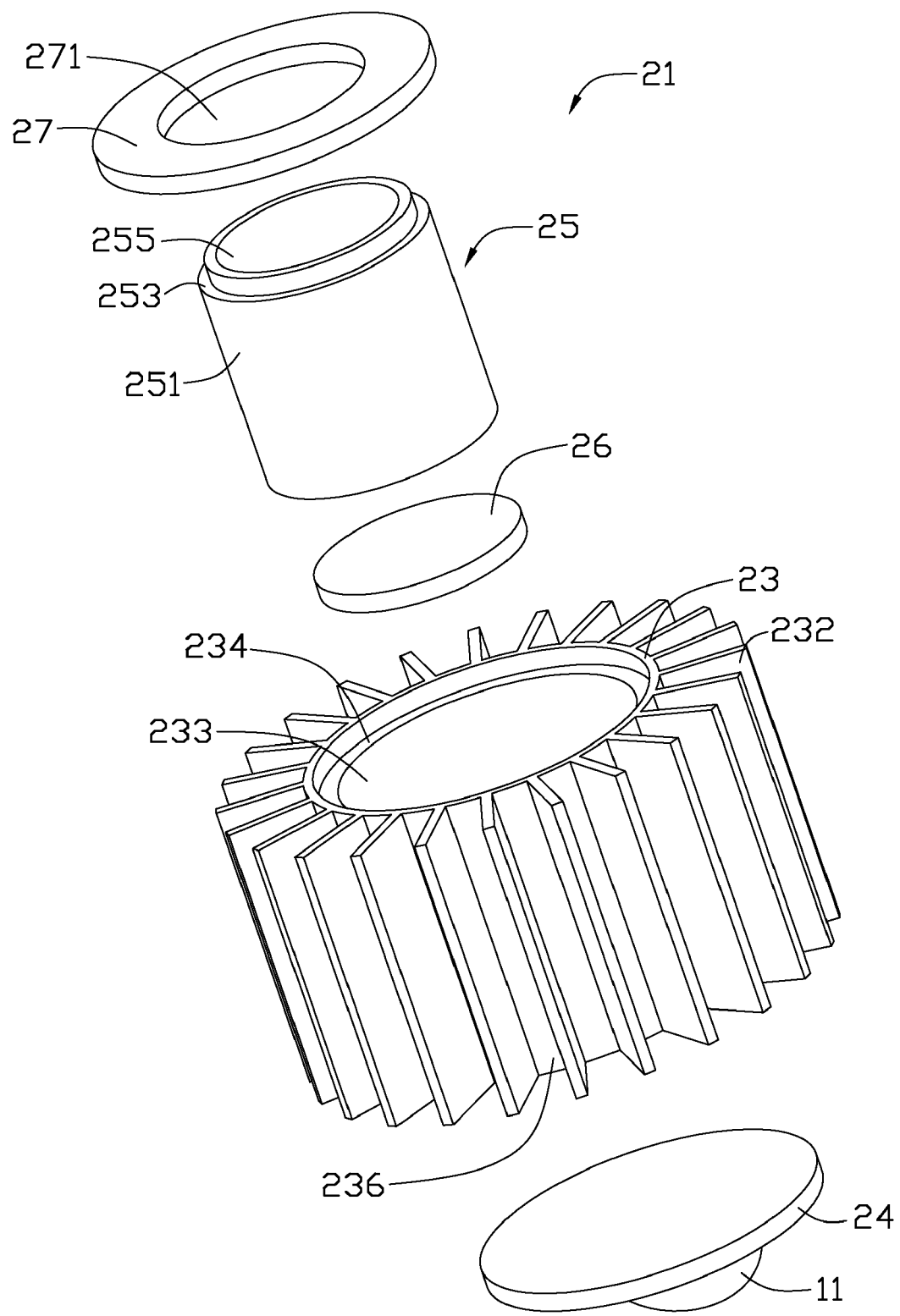
FIG. 3 is an exploded, isometric view of the light engine of FIG. 2.

The heat dissipation section 20 is provided with a loop heat exchange device 22. The loop heat exchange device 22 includes a hollow metal base 231 and a plurality of metal fins 232 extending outwardly from the hollow metal base 231. Referring also to FIGS. 2-3, the loop heat exchange device 22 and the light source 11 cooperatively form a light engine 21 for the LED illuminating device 100. The hollow metal base 231 includes an inner metal tube 25, an outer metal tube 23, a heat-absorbing plate 24, a circular cover plate 26, and an annular cover plate 27. Each of the inner metal tube 25 and the outer metal tube 23 is cylindrical. The outer metal tube 23 has a diameter greater than the inner metal tube 25. The inner metal tube 25 is coaxially received in the outer metal tube 23, with a first gap 281 defined between an inner circumferential surface 233 of the outer metal tube 23 and an outer circumferential surface 251 of the inner metal tube 25. The first gap 281 is annular in profile and extends axially along an axial direction of the hollow metal base 231. The metal fins 232 extend radially outwardly from an outer circumferential surface 236 of the outer metal tube 23.

The heat-absorbing plate 24 is attached to and hermetically seals a bottom of the outer metal tube 23. Particularly, an annular groove 235 is defined in the bottom of the outer metal tube 23, and an outer periphery of the heat-absorbing plate 24 is fixedly embedded in the annular groove 235. The circular cover plate 26 is attached to and hermetically seals a bottom of the inner metal tube 25. Particularly, an annular groove 254 is defined in the bottom of the inner metal tube 25, and an outer periphery of the circular cover plate 26 is fixedly embedded in the annular groove 254. A second gap 282 is defined between the circular cover plate 26 and the heat-absorbing plate 24. The second gap 282 communicates with a bottom of the first gap 281. The annular cover plate 27 spans between a top of the outer metal tube 23 and a top of the inner metal tube 25, and hermetically seals a top of the first gap 281, whereby a hermetical chamber 28 is cooperatively formed by the first gap 281 and the second gap 282 in the hollow metal base 231. Particularly, a first annular step 234 is defined in the top of the outer metal tube 23, a second annular step 253 is defined in the top of the inner metal tube 25, and the annular cover plate 27 is fixedly embedded in the first and the second annular steps 234, 253. The hermetical chamber 28 is cylindrical and has a U-shaped cross section along the axial direction of the hollow metal base 231.

A through hole 271 is defined at a center of the annular cover plate 27. A blind hole 252 is axially defined in the inner metal tube 25 through a top thereof. The blind hole 252 is enclosed by an inner circumferential surface 255 of the inner metal tube 25 and communicates with an outer environment via the top of the inner metal tube 25.

In the chamber 28, a first porous wick 221 is attached to an inner surface of the heat-absorbing plate 24. A second porous wick 222 is attached to an inner surface of the circular cover plate 26. A third porous wick 223 is attached to an inner surface of the annular cover plate 27. A fourth porous wick 224 is attached to the outer circumferential surface 251 of the inner metal tube 25. A fifth porous wick 225 is attached to the inner circumferential surface 233 of the outer metal tube 23. The first, the second, the third, the fourth and the fifth wicks 221, 222, 223, 224, 225 cooperatively form a wick structure in the chamber 28 of the metal base 231. Two ends of the fourth wick 224 connect with the second wick 222 and the third wick 223, respectively. Two ends of the fifth wick 225 connect with the first wick 221 and the third wick 223, respectively. Each of the first, the second, the third, the fourth and the fifth wicks 221, 222, 223, 224, 225 is selected from one of screen mesh, sintered powder, fiber, metal foam, and tiny grooves. A working fluid 226, such as water, alcohol is filled in the chamber 28 and saturated particularly in the first and the second wicks 221, 222.

The light source 11 is attached to an outer surface 241 of the heat-absorbing plate 24, whereby heat generated by the light source 11 is transferred to and effectively dissipated by the loop heat exchange device 22. The light source 11 includes a substrate 111 forming electrical circuits thereon, and at least one LED 112 (light emitting diode) arranged on the substrate 111 and electrically connected to the electrical circuits. The substrate 111 is attached to the outer surface 241 of the heat-absorbing plate 24. The LED 112 is electrically connected with the electrical wires 114 of the electrical section 30. Alternatively, electrical circuits formed on the substrate 111 can be directly formed on the outer surface 241 of the heat-absorbing plate 24, and the LED 112 is directly attached to the outer surface 241 of the heat-absorbing plate 24, whereby the substrate 111 can be omitted and a heat resistance between the LED 112 and the heat-absorbing plate 24 is reduced. A layer of thermal interface material (TIM) may be applied between the substrate 111 and the outer surface 241 of the heat-absorbing plate 24 to eliminate an air interstice therebetween, to thereby enhance a heat conduction efficiency between the light source 11 and the heat-absorbing plate 24. Alternatively, the substrate 111 can be attached to the heat-absorbing plate 24 fixedly and intimately through surface mount technology (SMT).

In the embodiment, the inner metal tube 25, the outer metal tube 23, the heat-absorbing plate 24, the circular cover plate 26 and the annular cover plate 27 are individually formed and then connected together to form the hollow metal base 22. In fact, two or more of these elements can be integrally formed, to thereby omit an assembly process of these individual elements.

In operation, heat generated by the LED 112 is absorbed by the heat-absorbing plate 24. The heat of the LED 112 is rapidly transferred from the heat-absorbing plate 24 to the working fluid 226 in the chamber 28. The working fluid 226 then vaporizes into vapor. The vapor accumulates in the second gap 282 and then flows upwardly along the first gap 281 of the chamber 28, as indicated by arrows 283. As the vapor goes up along the first gap 281, the heat carried by the vapor is released to the inner metal tube 25 and the outer metal tube 23, and dissipated to ambient atmosphere particularly by the metal fins 232. After the vapor releases the heat, the vapor is condensed into liquid. The liquid is absorbed by the fourth and the fifth wicks 224, 225, and then drawn back to the first and the second wicks 221, 222 via capillary forces provided by the fourth and the fifth wicks 224, 225. The liquid returned back to the first and the second wicks 221, 222 is available for a next phase change cycle, whereby the heat of the LED 112 is continuously and effectively removed by the loop heat exchange device 22.

Figure 4:
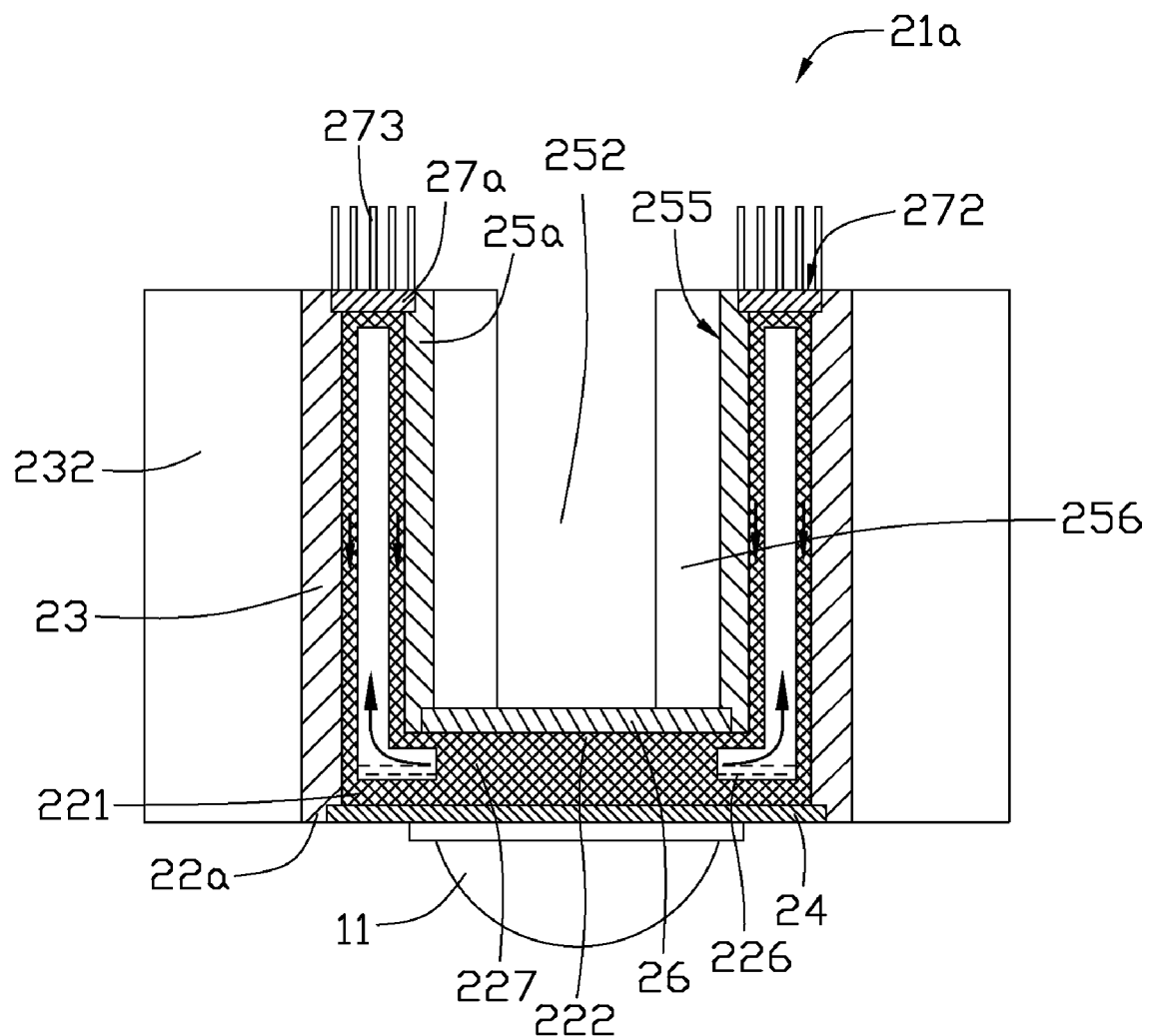
FIG. 4 shows an alternative light engine for the LED illuminating device.

Referring to FIG. 4, an alternative light engine 21a for the LED illuminating device 100 is illustrated. The light engine 21a includes a loop heat exchange device 22a and the light source 11. Except the following differences, the loop heat exchange device 22a of the present embodiment is essentially the same as the loop heat exchange device 22 shown in FIGS. 1-3. In the present embodiment, the first wick 221 and the second wick 222 are connected together by a sixth wick 227. The sixth wick 227 has a length slightly shorter than each of the first and the second wicks 221, 222. A plurality of metal fins 256 extends radially inwardly from the inner circumferential surface 255 of the inner metal tube 25a into the blind hole 252. A plurality of metal fins 273 extends upwardly from a top surface 272 of the annular cover plate 27a. In the present embodiment, a relatively large amount of working fluid 226 is saturated in the first, the second and the sixth wicks 221, 222, 227, and a relatively large heat exchange surface is provided due to the presence of the metal fins 256, 273, whereby the light engine 21a has a relatively high heat dissipation efficiency.

Figure 5:
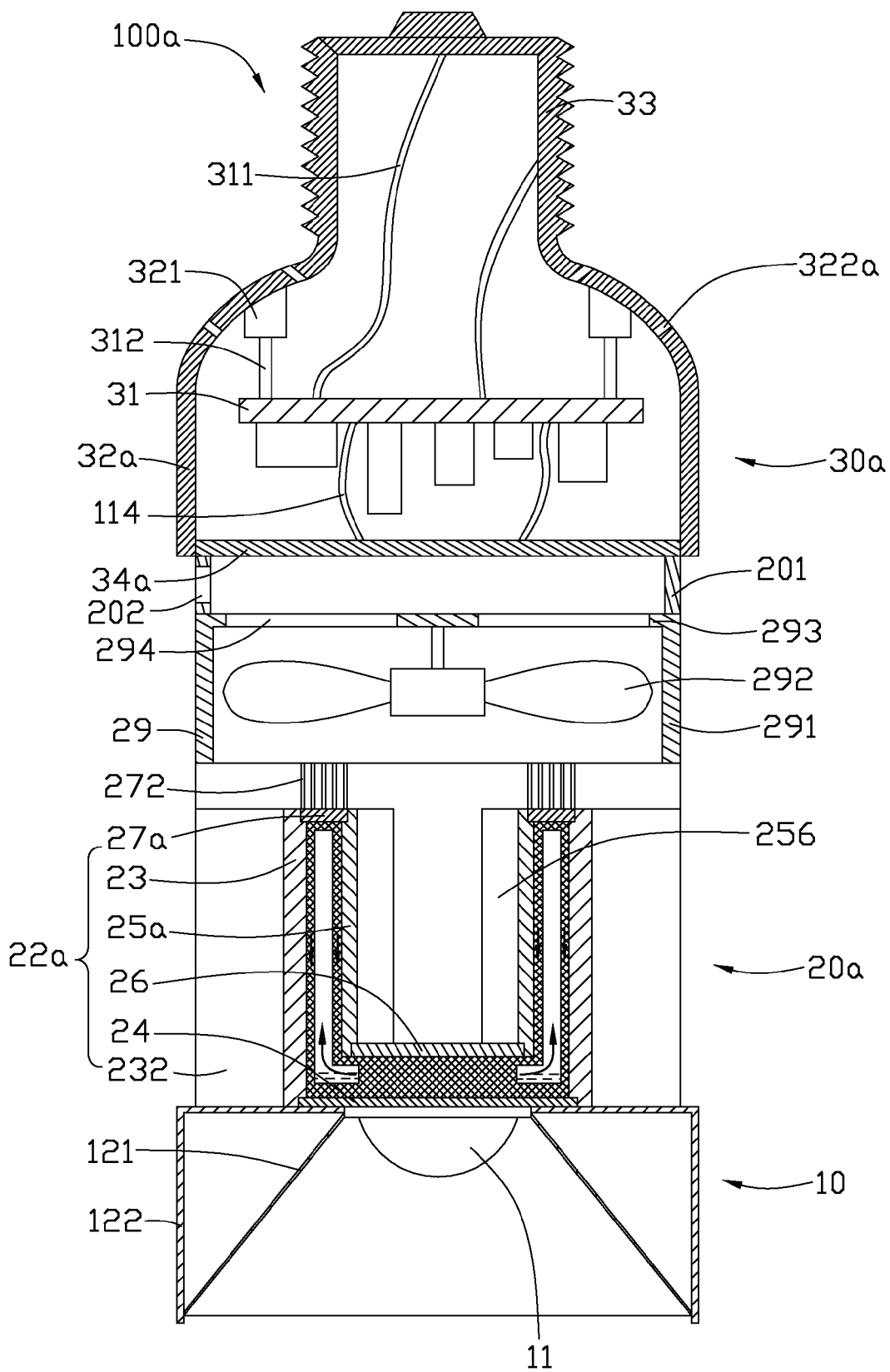
FIG. 5 is a cross-sectional view of an LED illuminating device in accordance with an alternative embodiment.

Referring to FIG. 5, an LED illuminating device 100a according to an alternative embodiment of the present invention is illustrated. Except the following differences, the LED illuminating device 100a of the present embodiment is essentially the same as the LED illuminating device 100 shown in FIG. 1, wherein the light engine 21 is replaced by the light engine 21a of FIG. 4. In the present embodiment, a cooling fan 29 is provided in the heat dissipation section 20a and arranged over the loop heat exchange device 22a. The cooling fan 29 is located between the loop heat exchange device 22a and the electrical section 30a. The cooling fan 29 includes a fan housing 291 and a fan impeller 292 rotatably mounted to a top plate 293 of the fan housing 291. A plurality of air passage openings 294 are defined in the top plate 293 of the fan housing 291. An annular spacer 201 is interposed between the cooling fan 29 and the partition plate 34a of the electrical section 30. A plurality of air passage openings 202 are defined through a circumferential periphery of the spacer 201. A plurality of small-sized air passage holes 322a are radially defined through the casing 32a of the electrical section 30a at a position adjacent to the lamp head 33.

The cooling fan 29 can be configured to begin operation as soon as the LED 112 starts emitting light. Alternatively, the cooling fan 29 can be automatically activated to rotate when a junction temperature of the LED 112 reaches a specified temperature value after the LED 112 has worked for a particular time period, and the cooling fan 29 does not operate when the junction temperature of the LED 112 is below the specified temperature value. When the cooling fan 29 does not operate, the heat of the LED 112 is mainly dissipated by the loop heat exchange device 22a.

When the cooling fan 29 operates, the cooling fan 29 inhales air from the ambient atmosphere via the air passage openings 202 of the spacer 201. The inhaled air then enters into the fan housing 291 via the air passage openings 294 of the top plate 293 of the fan housing 291. An airflow is therefore generated by the cooling fan 29 and flows towards the loop heat exchange device 22a, whereby a forced air convection is circulated in the LED illuminating device 100a.

Figure 6:
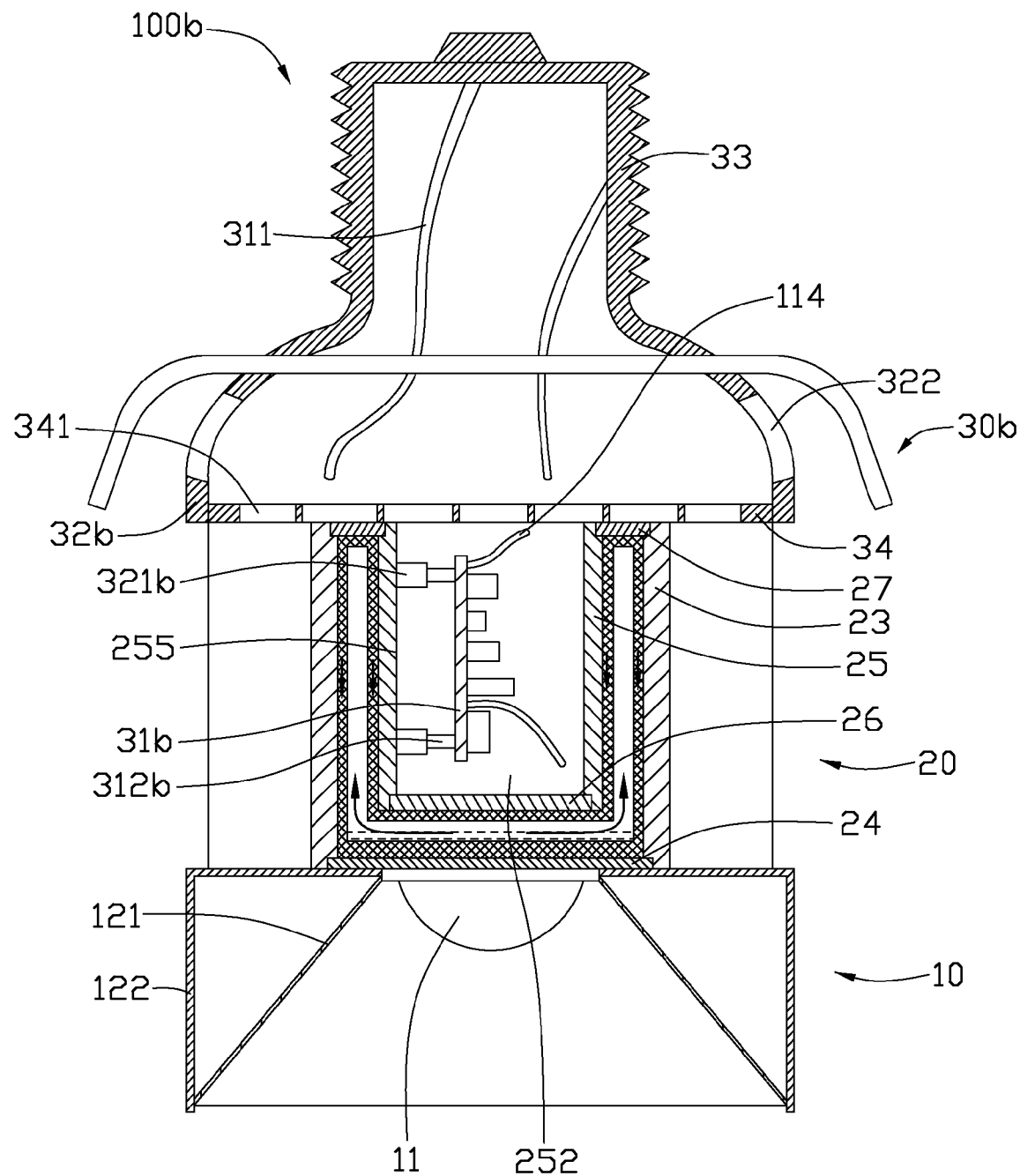
FIG. 6 is a cross-sectional view of an LED illuminating device in accordance with another alternative embodiment.

Referring to FIG. 6, an LED illuminating device 100b according to another alternative embodiment of the present invention is illustrated. Except the following differences, the LED illuminating device 100b of the present embodiment is essentially the same as the LED illuminating device 100 shown in FIG. 1. In the present embodiment, the circuit board 31b is moved from the casing 32b of the electrical section 30b to the blind hole 252 of the inner metal tube 25. Particularly, the circuit board 31b is received in the blind hole 252 and fixed to the inner circumferential surface 255 of the inner metal tube 25 via mounting poles 312b and mounting seats 321b, so that the circuit board 31b can be cooled by the loop heat exchange device. Since the circuit board 31b is removed away from the casing 32b, the electrical section 30b can have a shorter length whereby the LED illuminating device 100b can have a more compact structure.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
an optical section being provided with a light source therein;
an electrical section being electrically connected with the light source; and
a heat dissipation section located between the optical section and the electrical section, the heat dissipation section being provided with a loop heat exchange device, the loop heat exchange device comprising a hollow metal base and a plurality of metal fins extending outwardly from the hollow metal base, a hermetical chamber being defined in the hollow metal base, the hermetical chamber being cylindrical and having a U-shaped cross section along an axial direction of the hollow metal base, a wick structure being attached to an inner surface of the hermetical chamber, a working fluid being saturated in the wick structure, the light source being thermally attached to the hollow metal base.

2. The LED illuminating device of claim 1, wherein the hollow metal base comprises an inner metal tube and an outer metal tube, the outer metal tube has a diameter greater than the inner metal tube, the inner metal tube is coaxially received in the outer metal tube with a first gap defined between an inner circumferential surface of the outer metal tube and an outer circumferential surface of the inner metal tube, the first gap extends axially along the axial direction of the hollow metal base, and the metal fins extend radially outwardly from an outer circumferential surface of the outer metal tube.

3. The LED illuminating device of claim 2, wherein the hollow metal base further comprises a heat-absorbing plate, a circular cover plate and an annular cover plate, the heat-absorbing plate hermetically seals a bottom of the outer metal tube, the circular cover plate hermetically seals a bottom of the inner metal tube, a second gap is defined between the circular cover plate and the heat-absorbing plate, the second gap communicates with a bottom of the first gap, the annular cover plate hermetically seals a top of the first gap, the hermetical chamber is cooperatively formed by the first gap and the second gap in the hollow metal base, and the light source is attached to the heat-absorbing plate.

4. The LED illuminating device of claim 3, wherein a top of the inner metal tube facing the electrical section is open, a blind hole is axially defined in the inner metal tube, and the blind hole is enclosed by an inner circumferential surface of the inner metal tube and communicates with an outer environment.

5. The LED illuminating device of claim 4, wherein a plurality of metal fins extends radially inwardly from the inner circumferential surface of the inner metal tube into the blind hole.

6. The LED illuminating device of claim 4, wherein the electrical section comprises a casing, a plurality of air passage holes are provided through a circumferential periphery of the casing, a circuit board is received in the blind hole of the inner metal tube, and the light source is electrically connected with the circuit board.

7. The LED illuminating device of claim 3, wherein a plurality of metal fins extends upwardly from a top surface of the annular cover plate.

8. The LED illuminating device of claim 3, wherein the wick structure comprises a first porous wick attached to an inner surface of the heat-absorbing plate, a second porous wick attached to an inner surface of the circular cover plate, a third porous wick attached to an inner surface of the annular cover plate, a fourth porous wick attached to the outer circumferential surface of the inner metal tube, and a fifth porous wick attached to the inner circumferential surface of the outer metal tube, two ends of the fourth wick connect respectively with the second wick and the third wick, and two ends of the fifth wick connect respectively with the first wick and the third wick.

9. The LED illuminating device of claim 8, wherein the first wick and the second wick are connected together by a sixth wick therebetween.

10. The LED illuminating device of claim 3, wherein the electrical section comprises a casing and a circuit board received in the casing, a plurality of air passage holes are provided through a circumferential periphery of the casing, and the light source is electrically connected with the circuit board.

11. The LED illuminating device of claim 3, wherein a cooling fan is provided over the loop heat exchange device and configured to generate an airflow through the loop heat exchange device, and the cooling fan is located between the loop heat exchange device and the electrical section.

12. The LED illuminating device of claim 11, wherein a spacer is provided between the cooling fan and the electrical section, a plurality of air passage openings are defined radially through a circumferential periphery of the spacer, and the airflow flows through the air passage openings of the spacer.

13. A light engine of an LED illuminating device, comprising:
a light source; and
a loop heat exchange device comprising a hollow metal base and a plurality of metal fins extending outwardly from the hollow metal base, a hermetical chamber being defined in the hollow metal base, the hermetical chamber comprising an annular first gap at a top side thereof and a second gap at a bottom side thereof and communicating with a bottom of the first gap, the first gap extending upwardly from a periphery of the second gap, a wick structure being attached to an inner surface of the hermetical chamber, a working fluid being saturated in the wick structure, the light source being thermally attached to a bottom of the hollow metal base.

14. The light engine of the LED illuminating device of claim 13, wherein the hollow metal base comprises an inner metal tube and an outer metal tube, the outer metal tube has a diameter greater than the inner metal tube, the inner metal tube is coaxially received in the outer metal tube, the first gap being defined between an inner circumferential surface of the outer metal tube and an outer circumferential surface of the inner metal tube, and the metal fins extend radially outwardly from an outer circumferential surface of the outer metal tube.

15. The light engine of the LED illuminating device of claim 14, wherein the hollow metal base further comprises a heat-absorbing plate, a circular cover plate and an annular cover plate, the heat-absorbing plate hermetically seals a bottom of the outer metal tube, the circular cover plate hermetically seals a bottom of the inner metal tube, the second gap is defined between the circular cover plate and the heat-absorbing plate, the annular cover plate hermetically seals a top of the first gap, and the light source is attached to the heat-absorbing plate.

16. The light engine of the LED illuminating device of claim 15, wherein a top of the inner metal tube is open, a blind hole is axially defined in the inner metal tube, the blind hole is enclosed by an inner circumferential surface of the inner metal tube and communicates with an outer environment.

17. The light engine of the LED illuminating device of claim 16, wherein a plurality of metal fins extends radially inwardly from the inner circumferential surface of the inner metal tube into the blind hole.

18. The light engine of the LED illuminating device of claim 15, wherein a plurality of metal fins extends upwardly from a top surface of the annular cover plate.

19. The light engine of the LED illuminating device of claim 15, wherein the wick structure comprises a first porous wick attached to an inner surface of the heat-absorbing plate, a second porous wick attached to an inner surface of the circular cover plate, a third porous wick attached to an inner surface of the annular cover plate, a fourth porous wick attached to the outer circumferential surface of the inner metal tube, and a fifth porous wick attached to the inner circumferential surface of the outer metal tube, two ends of the fourth wick connect respectively with the second wick and the third wick, two ends of the fifth wick connect respectively with the first wick and the third wick.

20. The light engine of the LED illuminating device of claim 19, wherein the first wick and the second wick are connected together by a sixth wick therebetween.

* * * * *